United States Patent [19]

Lee

[11] Patent Number: 4,584,493
[45] Date of Patent: Apr. 22, 1986

[54] SELF REFERENCED SENSE AMPLIFIER
[75] Inventor: Donald T. Y. Lee, Santa Clara, Calif.
[73] Assignee: Signetics Corporation, Sunnyvale, Calif.
[21] Appl. No.: 658,000
[22] Filed: Oct. 5, 1984
[51] Int. Cl.[4] .................. H03K 5/19; G01R 19/165; G11C 7/06
[52] U.S. Cl. .................................. 307/530; 307/578; 307/279; 365/189; 365/203; 365/208
[58] Field of Search ............... 307/530, 482, 578, 362, 307/475, 246, 279, 290; 365/94, 104, 189, 203, 205, 208

[56]  References Cited
U.S. PATENT DOCUMENTS

| 3,560,765 | 2/1971 | Kubinec | 307/557 X |
| 4,300,213 | 11/1981 | Tanimura et al. | 307/530 X |
| 4,398,270 | 8/1983 | Taylor | 365/203 |
| 4,412,139 | 10/1983 | Horninger | 307/270 |
| 4,443,718 | 4/1984 | Hagiwara et al. | 307/530 |
| 4,518,879 | 5/1985 | Greene | 307/530 |
| 4,529,889 | 7/1985 | Dumbri | 307/530 X |
| 4,535,259 | 8/1985 | Smarandoiu et al. | 307/530 |
| 4,544,853 | 10/1985 | Neal et al. | 307/530 |

OTHER PUBLICATIONS

Lambrechtse et al., *1973 IEEE ISSCC;* Session II: FET Memory; Digest of Technical Papers; p. 26.
Chakravarti, "High Gain Sense Amplifier", *IBM TDB;* vol. 20, No. 7, pp. 2607–2608; 12/1977.

*Primary Examiner*—Larry N. Anagnos
*Attorney, Agent, or Firm*—Robert T. Mayer

[57]  ABSTRACT

A sense amplifier with two input control stages whose input voltages are equalized during a precharge cycle by a switching means.

8 Claims, 1 Drawing Figure

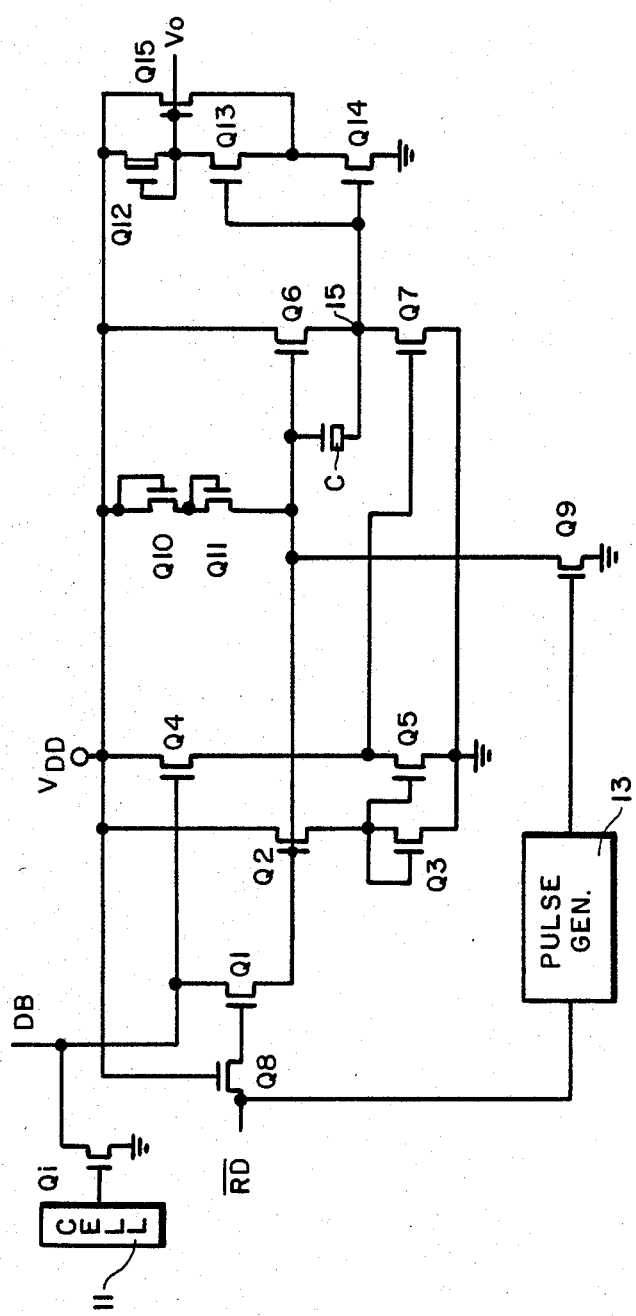

SELF REFERENCED SENSE AMPLIFIER

This is an invention in integrated circuitry. More particularly, it involves such circuitry using field effect transistors (FETs) in sense amplifiers.

Usually an FET sense amplifier for a memory device will operate with a reference voltage or with a dummy cell.

It is an object of this invention to provide a self-referenced FET sense amplifier.

One of the features of the invention is its speed of operation over a wide range of precharge voltages.

An advantage of the invention is that it can be used in applications other than with memory devices. Generally speaking, the sense amplifier of the invention can be used in any circuit that involves reading precharged binary data.

In accordance with the invention there is provided a sense amplifier for use in connection with a signal line to read information appearing as binary signals on the signal line during READ operations. The signal line is precharged before each READ operation and the sense amplifier comprises a first control stage including first and second series connected enhancement type FETs. The gate of the first FET is connectable to the signal line. The first control stage has an output connected between its FETs to which the gate of the second FET is connected. A second control stage including first and second series connected enhancement type FETs also comprises part of the sense amplifier. The gate of the first FET of the second stage is connected to the signal line. The gate of the second FET of the second stage is connected to the output of the first control stage. The second control stage has an output connected between its FETs also. The sense amplifier also includes an output stage having first and second series connected enhancement type FETs. The gate of the first FET of this output stage is connectable to the signal line. The gate of the second FET of the output stage is connected to the output of the second control stage. The output stage has an output means connected between its FETs. Switching means are also included as part of the sense amplifier. The switching means connects the gates of the first FETs of the first control stage and the output stage to the signal line prior to each READ operation and disconnects them therefrom at the start of each READ operation.

Other objects, features and advantages of the invention will be apparent to those skilled in the art from the following description and appended claims when considered in conjunction with the accompanying drawing in which:

The sole FIGURE is a schematic diagram of the sense amplifier of the invention.

Referring to the drawing, there is shown a memory cell 11 which may take any one of various well known forms. In the disclosed embodiment the output of the cell is connected to an enhancement type IGFET $Q_i$ connected between ground and a data bus DB. As those skilled in the art understand, IGFET $Q_i$ could be eliminated and replaced by a similar IGFET which is an integral part of cell 11. Data bus DB comprises the signal line referred to in the claims. It is connected to a switching means comprising enhancement type IGFET Q1. More particularly, data bus DB is connected to the source of IGFET Q1 whose gate is connected to the drain of enhancement type IGFET Q8. The drain of IGFET Q1 is connected to the gate of IGFET Q2 which comprises the first IGFET of a first control stage comprising IGFETs Q2 and Q3 both of which are enhancement type IGFETs. IGFET Q3 is the second IGFET of the first control stage. The drain of IGFET Q2 is connected to voltage source $V_{DD}$. Its source is connected to the drain of second IGFET Q3 of the first control stage. The source of IGFET Q3 is connected to ground and its gate is connected to its drain. The output of the first control stage is connected between its IGFETs and connected to the gate of the second IGFET Q5 of a second control stage.

The source of the second IGFET Q5 of the second control stage is connected to ground and its drain is connected to the source of the first IGFET Q4 of the second control stage. Both IGFETs Q4 and Q5 are enhancement type. The gate of the first IGFET Q4 of the second control stage is connected to the data bus DB. Its drain is connected to voltage source $V_{DD}$. An output for the second control stage is provided between its two IGFETs and connected to the gate of the second IGFET Q7 of the output stage of the sense amplifier. The source of IGFET Q7 is connected to ground while its drain is connected to the source of the first IGFET Q6 of the output stage. Both IGFETs Q6 and Q7 are enhancement type. The drain of IGFET Q6 is connected to the voltage source $V_{DD}$. The gate of the first IGFET Q6 of the output stage is connected to the drain of IGFET Q1. A depletion type capacitor C is connected between the gate and the source of IGFET Q6.

The output of the output stage is connected between its two IGFETs and includes a Schmitt trigger which in the disclosed embodiment comprises depletion IGFET Q12 and enhancement type IGFETs Q13, Q14 and Q15. The drain of IGFET Q12 is connected to voltage source $V_{DD}$. Its gate is connected to its source which is connected to the drain of IGFET Q13. Its gate is connected to the gate of IGFET Q14 and both are connected to the source of IGFET Q6 and the drain of IGFET Q7. The source of IGFET Q14 is connected to ground and its drain to the sources of IGFETs Q13 and Q15. The gate of IGFET Q15 is connected to the gate and source of IGFET Q12 and the drain of IGFET Q13. The drain of IGFET Q15 is connected to the voltage source $V_{DD}$. Those skilled in the art will understand that other arrangements with the same operating characteristics could be substituted for the disclosed Schmitt trigger. The output of the sense amplifier is applied along line $V_O$ from the gate of IGFET Q15.

The switching means of the invention also includes enhancement type IGFET Q8 whose gate is connected to voltage source $V_{DD}$. The source of IGFET Q8 is connected to the read enable not line $\overline{RD}$. This line is also connected to an edge detecting single pulse generator 13 whose output is connected to the gate of enhancement type IGFET Q9. The source of IGFET Q9 is connected to ground and its drain is connected to the gate of IGFET Q2.

An additional pair of enhancement type IGFETs Q10 and Q11, one of which, Q10, is a zero threshold type, are also provided with the sense amplifier of the invention. The drain and gate of IGFET Q10 are both connected to voltage source $V_{DD}$. Its source is connected to both the drain and the gate of IGFET Q11. The source of IGFET Q11 is connected to the gate of IGFET Q2.

In operation, before a reading operation takes place, the signal along line $\overline{RD}$ is high. IGFET Q8 conducts this signal to the gate of IGFET Q1 turning it on. With data bus DB being precharged, in any well known manner, IGFET Q1 equalizes the voltage to the gates of IGFETs Q2 and Q4. As a result both IGFETs are turned on. The voltage on the gate of IGFET Q2 is also applied to the gate of IGFET Q6 and it is also turned on.

IGFET Q3 is on as well and the first control stage applies a voltage from its output to the gate of IGFET Q5 of the second stage. This turns IGFET Q5 on as well. With IGFETs Q4 and Q5 both on, the output of the second control stage applies a voltage to the gate of IGFET Q7 of the output stage turning IGFET Q7 on. With both IGFETs Q6 and Q7 on, the voltage applied to the gates of IGFETs Q13 and Q14 of the Schmitt trigger is low causing both to remain off. As a result depletion IGFET Q12 provides a binary 1 along line $V_O$ and to the gate of IGFET Q15 turning it on.

During a reading operation the voltage on line $\overline{RD}$ goes low and IGFET Q1 is turned off. Should cell 11 be storing a binary 1, IGFET $Q_i$ remains off and a binary 1 remains on data bus DB. This maintains IGFET Q4 on and the rest of the sense amplifier remains in the condition previously described.

Should cell 11 be storing a binary 0, IGFET $Q_i$ turns on to indicate this and the data bus DB goes low during the reading operation. This lowers the voltage on the gate of IGFET Q4. As a result IGFET Q4 transfers from a first condition to a second condition in which it sources less current. Consequently, the output from the second control stage goes low lowering the voltage on the gate of IGFET Q7. This causes IGFET Q7 to transfer from a first condition to a second condition in which it sinks less current. As a result the output signal at node 15 between IGFETs Q6 and Q7 goes high. The speed at which this takes place is assisted by the bootstrapping operation of capacitor C. Node 15 being high causes IGFET Q14 to turn on driving the source of IGFET Q13 low. IGFET Q13 thereby turns on and output line $V_O$ and the gate of IGFET Q15 are brought low to indicate the binary 0 being stored in cell 11.

Edge detecting signal pulse generator 13 and IGFET Q9 ensure that IGFET Q1 will turn on again the next time the signal along read enable not line $\overline{RD}$ goes high. The signal along line $\overline{RD}$ going high causes generator 13 to produce a pulse of a prescribed duration. The pulse from pulse generator 13 causes IGFET Q9 to turn on for the length of the pulse generated by generator 13 thereby pulling the gate of IGFET Q2 and the drain of IGFET Q1 to ground. This ensures that when the precharge voltage appears along data bus DB for the next cycle IGFET Q1 will conduct to turn IGFET Q2 back on. In conducting IGFET Q1 also ensures the equalization of the voltages at the gates of IGFETs Q2 and Q4. IGFETs Q10 and Q11 ensure that the gate of IGFET Q2 stays high and does not discharge during a lengthy READ operation.

It is understood that various modifications to the above described arrangement of the invention will be evident to those skilled in the art and that the arrangement described herein is for illustrative purposes and is not to be considered restrictive.

What is claimed is:

1. A sense amplifier for use in connection with a signal line to read information appearing as binary signals on said signal line during READ operations, said signal line being precharged before each READ operation, said sense amplifier comprising a first control stage including first and second series connected enhancement type FETs, the gate of said first FET being connectable to said signal line, said first control stage having an output connected between its FETs, the gate of said second FET being connected to said output; a second control stage including first and second series connected enhancement type FETs, the gate of said first FET of the second stage being connected to said signal line, the gate of said second FET of said second stage being connected to the output of the first control stage, said second control stage having an output connected between its FETs; an output stage including first and second series connected enhancement type FETs, the gate of said first FET of said output stage being connectable to said signal line, the gate of said second FET of said output stage being connected to the output of said second control stage, said output stage having an output means connected between its FETs; and switching means connecting the gates of the first FETs of said first control stage and said output stage to said signal line prior to each READ operation and disconnecting them therefrom at the start of each READ operation.

2. A sense amplifier according to claim 1, wherein said switching means includes an enhancement type FET which is turned on prior to each READ operation to equalize the voltage on the gate of the first FET of the first stage with that on the gate of the first FET of the second stage during the precharge preceding each READ operation.

3. A sense amplifier according to claim 2, wherein all of said FETs are in a first condition during the precharge preceding each READ operation and wherein said switching means FET is turned off at the start of each READ operation whereby if said signal line has a binary 1 applied along it during a READ operation all of said FETs remain in said first condition to signify said binary 1 and if said signal line has a binary 0 applied along it during a read operation the first FET of said second stage and the second FET of said output stage switch to a second condition during the READ operation to signify said binary 0.

4. A sense amplifier according to claim 3, wherein a capacitor is connected between the gate of said first FET of said output stage and the drain of said second FET thereof to increase the speed at which said output stage signifies the application of a binary 0 along said signal line over the speed at which it would so signify in the absence of said capacitor.

5. A sense amplifier according to claim 4, wherein said output stage includes a Schmitt trigger connected as the output means of said output stage.

6. A sense amplifier according to claim 5 including a discharge means discharging the gate of the first FET of said first stage at the end of each READ operation.

7. A sense amplifier according to claim 6, wherein the discharge means includes a single pulse generator and an enhancement type discharge FET connected between the gate of said first FET of said first stage and ground, said generator producing a single pulse at the end of each READ operation which turns on said discharge FET to connect the gate of the first FET of said first stage to ground.

8. A sense amplifier as in claim 7, wherein said switching means includes a second enhancement type FET through which the first enhancement type FET of said switching means is controlled to be turned on prior to each READ operation and to be turned off at the start of each READ operation.

* * * * *